(12) United States Patent
Kumar

(10) Patent No.: US 7,403,577 B2
(45) Date of Patent: Jul. 22, 2008

(54) GENERALIZED POLYPHASE CHANNELIZATION SYSTEM

(75) Inventor: Rajendra Kumar, Cerritos, CA (US)

(73) Assignee: The Aerospace Corporation, El Segundo, CA (US)

( * ) Notice: Subject to any disclaimer, the term of this patent is extended or adjusted under 35 U.S.C. 154(b) by 786 days.

(21) Appl. No.: 10/864,201

(22) Filed: Jun. 9, 2004

(65) Prior Publication Data
US 2005/0276335 A1 Dec. 15, 2005

(51) Int. Cl.
*H04L 27/00* (2006.01)
(52) U.S. Cl. ....................................... 375/324
(58) Field of Classification Search ................. 375/325, 375/260, 261; 370/210, 342, 485, 486; 708/403, 708/404
See application file for complete search history.

(56) References Cited

U.S. PATENT DOCUMENTS 5,550,872 A * 8/1996 Liberti et al. ............... 375/347
6,522,243 B1 * 2/2003 Saulnier et al. ............. 375/130
6,735,221 B1 * 5/2004 Cherubini ................... 370/485
2004/0127223 A1 * 7/2004 Li et al. ....................... 455/446

* cited by examiner

*Primary Examiner*—Chieh M. Fan
*Assistant Examiner*—Jaison Joseph
(74) *Attorney, Agent, or Firm*—Derrick Michael Reid

(57) ABSTRACT

A computation efficient polyphase channelization system enables one of many user FDMA signals to be channelized through multiple FFT response frequency bands forming an aggregate frequency band where K-point FFT channels are greater than the decimation factor M to produce FFT overlapped responses that have a smooth aggregate response without disjointed band gaps for reduced distortion using a clockwise commutator having M channels feeding M filter blocks, each of which having $\beta$ polyphase filters, and having a ring switch to provide smooth filter responses that then drive $\beta$ K-point FFTs to provide a $\beta$ set of K vector FFT responses that are then combined in a post processing system for producing K channelized outputs.

9 Claims, 6 Drawing Sheets

GENERALIZED POLYPHASE ANALYZER

GENERALIZED POLYPHASE ANALYZER $j^{th}$ FILTER BLOCK

RING SWITCH

GENERALIZED POLYPHASE SYNTHESIZER $k^{th}$ TIME VARYING FILTER BLOCK

OUTPUT COMMUTATOR

GENERALIZED POLYPHASE CHANNELIZATION SYSTEM

STATEMENT OF GOVERNMENT INTEREST

The invention was made with Government support under contract No. F04701-00-C-0009 by the Department of the Air Force. The Government has certain rights in the invention.

FIELD OF THE INVENTION

The invention relates to the field of communications and signal processing systems. More particularly, the present invention relates to channelization of wide band signals for the preferred use in frequency division multiple accessing communication systems.

BACKGROUND OF THE INVENTION

The present and future generations of satellites need to operate with small earth terminals such as mobile vehicle or hand held terminals. Such satellites need to be user oriented in that the user terminal needs to be relatively less complex, using low power, having low weight and low cost. Such requirement may be achieved at the cost of increasing the complexity, such as with space borne equipment and the central earth stations. Present day technology involves such processing on board the satellite. An example of such a system is mobile messaging service via satellites. In such a system, a forward link takes messages from an earth station to the satellite, which retransmits to the mobiles over spot beams. The return link begins at the mobiles, goes up to the satellite and terminates at the earth station. In such a system, the types of transmitter and receivers in the forward and reverse links may be different. Thus the optimum uplink and downlink designs to and from the mobiles and the earth stations may be very different requiring frequency translation achieved by channelization.

In the case of a multiple access communications system, the uplink uses frequency division multiple access (FDMA) signaling with low cost and low complexity terminals while the downlink uses time division multiple access (TDMA) signaling to maximize the satellite radiated power without intermodulation noise. In such systems, the small earth terminals do not need the capability of transmitting at very high burst rate and stringent satellite frame synchronization capabilities necessary for TDMA transmitter. In another multiple access system, uplink is based on random access technique while the downlink uses TDMA. In terms of modulation, all such multiple access systems make use of digital techniques with inherent advantages in terms of power efficiency, flexibility, error correction and detection coding and encryption. The feasibility of mixed mode multiple accessing techniques requires efficient means of translation between the two formats of multiple access system. Although analog techniques are in principle straightforward, in terms of implementation considerations of size, weight, cost, and flexibility, direct digital method are expected to achieve higher performance. Digital techniques can also fully exploit advances in VLSI and ASIC technologies to achieve these speed and costs objectives. Such translation may involve conversion of an FDMA signal into a TDM multiplexed signal, which may then go through a digital switch to various TDMA carriers being transmitted over the spot beams. Such digital translation techniques are also useful in the switching of FDMA carriers to different spot beams with out requiring arrays of analog bandpass filters and converters. There are several techniques for direct digital translation and switching using a channelization method where a wide band signal is channelized and individual channels are respectively processed.

Optimum system design in such cases may involve different multiple accessing techniques on the uplink and downlink. The feasibility of mixed mode multiple accessing techniques requires an efficient means of translation between the two formats of multiple accessing communication systems. There are several digital techniques available for translation, that is channelization, namely, an analytical signal method, a polyphase Discrete Fourier Transform (DFT) method, a frequency domain FFT filtering method, weight, overlap and add (WOLA) method, and a tree filter multistage bank method. The analytical signal method, frequency domain FFT filtering method, and the multistage filtering method are computationally complex, the weight, overlap and add method involves processing of the input signal in blocks. Among these prior methods, the polyphase DFT method is the most efficient in terms of computational efficiencies and processes the input signal on a sample-by-sample basis.

In terms of computational efficiency and the ease of sample-by-sample processing, the polyphase DFT approach is the most attractive as the number of computations required per sample of the input signal processing increases linearly with $\log_2 K$ where K is the number of channels. However, the polyphase channelizer that possesses this computational advantage is only applicable to the case where K is equal to the decimation factor M or an integer multiple. There are many significant applications where K is not equal to M or an integer multiple and it is desirable to achieve the same computational advantage as for the case of K equal to M.

The conventional polyphase DFT communication channelizer includes an analyzer for channelization and a synthesizer for dechannelization. The conventional polyphase DFT analyzer includes a front end complex downconverter for downconverting an input wideband signal into a complex input fed into an input clockwise commutator for round robin sampling for providing M channelized outputs. The M channelized outputs are fed into a filter bank of K filters to provide K filtered outputs to an FFT, the FFT outputs constitute the K channelized outputs. The input to the analyzer is the sampled version of the multiplexed signal comprising K channel signals. This polyphase DFT analyzer is computationally efficient where M=K providing a homogenous mapping between the M commutator output the K number of filters in the filter bank. That is, the polyphase analyzer includes a commutator followed by a bank of polyphase filters having filter outputs that are processed by the FFT processor. The FFT processor outputs are the desired K channels. All of the channel signals have equal one-sided bandwidth of B Hz. The sampled input is an analytic complex signal that may be obtained by a Hilbert transform operation on the real IF bandpass signal. In the polyphase analyzer for the case of K=M, all of the K channels share a common polyphase filter bank. The $i^{th}$ polyphase branch filter has a impulse response $\bar{p}_i(m)$ given by $\bar{p}_i(m)=h(mM-i)$ for $i=0, 1, \ldots, M-1$, where h is the impulse response of the desired analyzer prototype low pass filter.

Similarly, the polyphase synthesizer includes an inverse FFT processor, followed by a set of polyphase filters whose outputs are combined by a commutator to yield the desired synthesized multiplexed signal. The inverse FFT providing M inverse transformed outputs to a bank of filters having M filter outputs feeding a commutator for combining the M filter outputs into a complex output. The commutator provides the complex output that is then upconverted by an upconverter for forming a wideband output. In the polyphase synthesizer, all of the K channels share a polyphase filter bank with the $i^{th}$ polyphase filter impulse response $q_i(m)$ given by $q_i(m)=f(mM+i)$ for $i=0, 1, \ldots, M-1$ where f is the desired synthesizer prototype low pass filter impulse response. The total number of real multiplications required per second per channel are given by a $M_{PDFT}$ multiplication equation. In the $M_{PDFT}$ multiplication equation, the terms $\delta_1$ and $\delta_2$ are constants, the term B is the bandwidth, and the term w is the channel center frequency spacing.

$$M_{PDFT} = 2w\left[\frac{\left[\frac{2}{3}\log[1/(10\delta_1\delta_2)]\right]}{(w-2B)} + 4\log_2(K))\right]$$

However, the standard polyphase analyzer and synthesizer architecture is applicable to the case when the number of channels K is equal to the decimation factor M. When some user signals require larger frequency bands compared to other user signals, in principle, the user signal requiring larger frequency band may be allocated more than one adjacent channels out of K number of channels each of the same bandwidth. However, the filter roll off near the edges of the channels introduces band gaps among adjacent channels thus causing band gaps in the frequency band of the user allocated multiple channels which in turn causes distortion in the user signal. To avoid the problem of band gaps in the frequency band of the user with multiple channel allocation, it is desirable to introduce some overlap among the frequency response of adjacent channels. The said overlap is achieved by selecting the number of channels K greater than the decimation factor M. The selection of K greater than M thus provides signal fidelity to users assigned with multiple of the K channels. In the case when K>M, it is desirable to have similar computational and sample-by-sample processing advantages of the conventional polyphase architecture. Hence, it desirable to have a computationally efficient polyphase channelization system with a sample-by-sample processing architecture for the complex case where the number of channels K is not integrally related to the decimation factor M of the channelizer. Various modifications for the case when K is not integrally related to M, do not have the sample-by-sample processing and computational advantages of the conventional polyphase DFT method where essentially one filter operating at a single channel rate filters all the channels. In the case when some users require assignment of multiple channels, there is significant band gap and consequential distortion in the channelized signals when K is selected equal to M. These and other disadvantages are solved or reduced using the invention.

SUMMARY OF THE INVENTION

An object of the invention is to provide an analyzer for channelizing an input complex signal into channel signals.

Another object of the invention is to provide a channelizer having an analyzer for channelizing a complex input signal into channel signals and having a synthesizer for dechannelizing the channel signals into a complex output signal.

Yet another object of the invention is to provide a channelizer having an analyzer for channelizing a wideband input signal into channel signals and having a synthesizer for dechannelizing the channel signals into a wideband output signal.

Still another object of the invention is to provide a multiple access communication system having an analyzer for channelizing a wideband input signal into channel signals and having a synthesizer for dechannelizing the channel signals into a wideband output signal.

A further object of the invention is to provide an analyzer for channelizing an input complex signal decimated by a decimation factor M into K channel signals occupying K frequency bands where K is greater than M.

Yet a further object of the invention is to provide an analyzer for channelizing an input complex signal decimated by a decimation factor M into K channel signals respectively occupying K frequency bands where K is greater than M using a bank of M filter blocks and a bank of β K-point FFT processors each of which are for providing K frequency components.

Still a further object of the invention is to provide a channelizer having an analyzer for channelizing an input complex signal decimated by a decimation factor M into K channel signals respectively occupying K frequency bands where K is greater than M using a bank of N filter blocks feeding a bank of β K-point FFT processors each of which are for providing K frequency components for enabling a user signal to be channelized over a plurality of frequency bands with reduced distortion and with computation efficiency.

The present invention is directed to an analyzer for channelizing a complex input into K channel signals by a decimation factor M using a bank of filter blocks and a bank of FFT processors. The invention provides a computationally efficient and sample-by-sample processing architecture for the case when the number of channels K is greater than the decimation factor M. In a preferred form, a channelizer includes the analyzer and a compatible synthesizer. The analyzer and synthesizer can be used together in a multiple access communication system. The synthesizer is used to dechannelize the channelized signal into complex output signal. The number of channels K may be greater than the decimation factor M so that a user signal can be spread over multiple channel signals with improved signal fidelity while retaining computational efficiency. The required number of computations is computationally efficient and increases linearly with $\log_2$ (K) when K is greater than M. For broadband signals such computational requirements may be one of the dominant factors in determining the overall cost, weight, and power requirements of the satellite system, and as such, the invention has application to broadband multiple access systems such as the time division multiple access system.

The generalized polyphase analyzer includes an input clockwise commutator having round robin sampling with a decimation factor M to provide M sampled outputs. The M sampled outputs are fed into a set of M time-varying branch filter blocks each of which including a $j^{th}$ clockwise commutator followed by a set of β number of time-varying polyphase filters and a ring switch for providing β filtered outputs. The (M)×(β) filtered outputs of the time-varying filter blocks are then processed by a bank of β K-point FFT processors. The (M)×(β) filtered outputs feed the bank of β K-point FFT processors for generating (K)×(β) forward transformed signals that are combined using a post processing subsystem for generating the K channels signals in generalized approach. The weighted sums of the bank of β FFT processors constitute the channelizer outputs having frequency components in respective frequency bands.

A compatible generalized synthesizer architecture flows from the channelizer architecture. The synthesizer includes a K-point inverse FFT processor for receiving the channelized signals and for providing K inverse transformed outputs. The K-point inverse FFT processor is followed by a bank of K time-varying filter blocks for providing K filter outputs that are fed to a commutator for generating the complex output signal. The sequencing of filter weight vectors is determined by the ratio of K and M. The complex output signal can be upconverted into a wideband signal for broadband multiple access signaling.

Using the polyphase channelizer, a user signal can be channelized to occupy one or more frequency bands for desired signal allocation diversity with improved signal fidelity even when the user signal extends over frequency bandgaps that separate the occupied frequency bands. The generalized polyphase channelization system processes the sampled complex signal on a sample-by-sample basis and is computationally efficient even for the case when the number of channels K is not integrally related to the decimation factor M as the total required number of computations increases linearly with $\log_2(K)$. These and other advantages will become more apparent from the following detailed description of the preferred embodiment.

DETAILED DESCRIPTION OF THE PREFERRED EMBODIMENT

Figure 1:
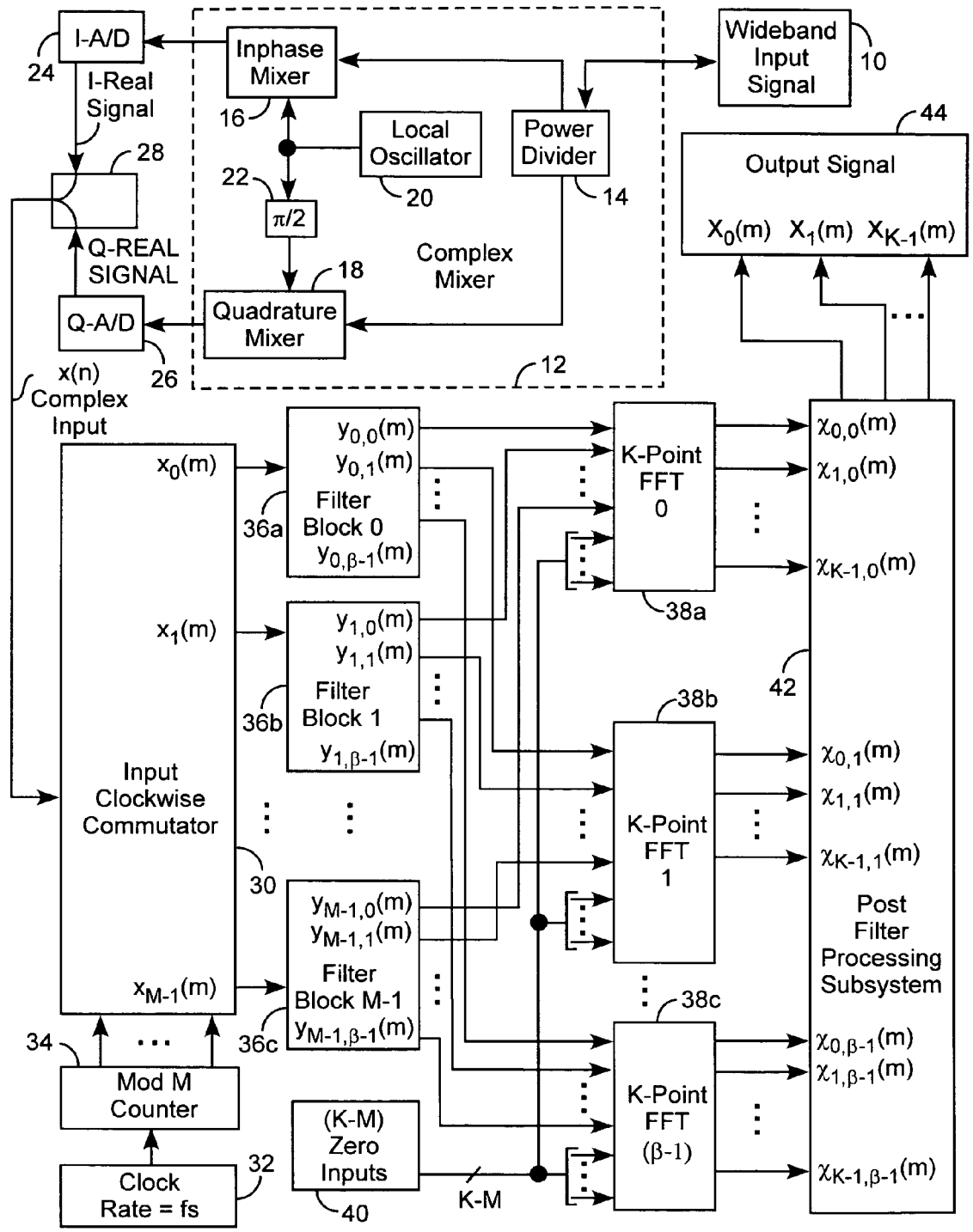
FIG. 1 is a block diagram of a generalized polyphase analyzer.
Figure 2:
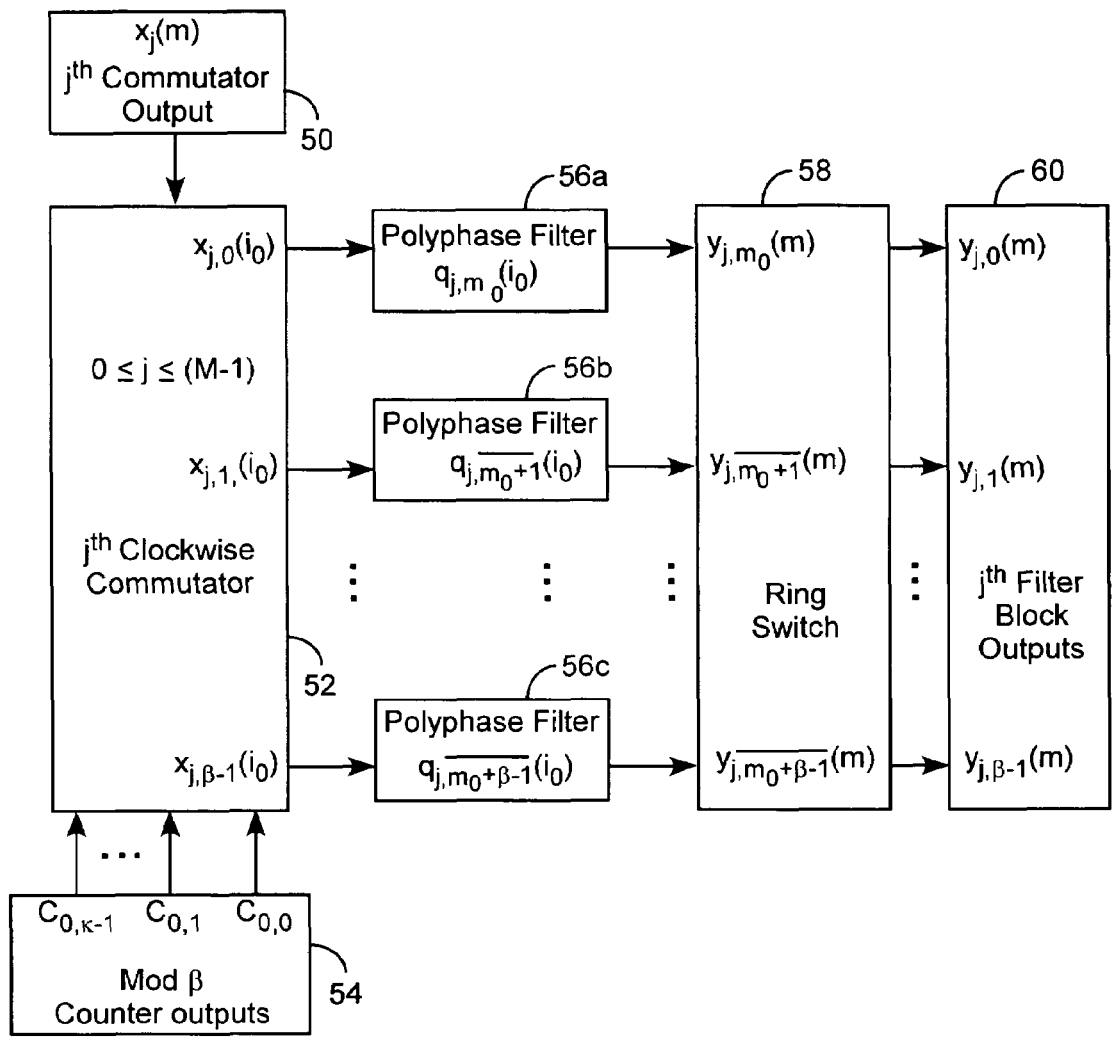
FIG. 2 is a block diagram of a $j^{th}$ filter block.

An embodiment of the invention is described with reference to the figures using reference designations as shown in the figures. A generalized polyphase channelization system includes an analyzer, as shown in FIG. 1. The analyzer includes a plurality of $j^{th}$ filter blocks, one of which is shown in FIG. 2, includes a ring switch shown in FIG. 3, and includes a post filter processing subsystem shown in FIG. 4. The generalized polyphase channelization system also includes a synthesizer shown in FIG. 5. The synthesizer includes a time-varying filter block shown in FIG. 6 and includes an output commutator shown in FIG. 7.

Referring to FIG. 1, the analyzer receives a wideband input signal 10 that includes many user channels signals, each of which may extend across one or more channel frequency bands designated as K channel signals. The wideband input signal 10 is processed through a complex mixer 12. A power divider 14 divides the wideband input signal 10 between inphase and quadrature components respectively received by an inphase mixer 16 and a quadrature mixer 18. A local oscillator 20 provides downconverting RF signal that is fed to the inphase mixer 16 and to a $\pi/2$ phase shifter 22 for providing a $\pi/2$ phase shifted local oscillator signal to the quadrature mixer 18. The inphase mixer 16 and quadrature mixer 18 respectively provide IF inphase I and quadrature Q signals to an inphase analog to digital converter 24 and a quadrature analog to digital converter 26. The converters 26 and 24 provide digital I and Q signals to a digital combiner 28 for forming an IF complex signal. The complex mixer 12, converters 24 and 26, and combiner 28 are well known conventional components.

The complex signal is fed into an input clockwise commutator 30. The input commutator 30 is a well known conventional component. A rate fs clock signal 32 drives a Mod M counter for providing sampling signals to the input commutator 30 for sampling the complex signal at a decimation factor M and for providing $x_0(m)$ through $x_{M-1}(m)$ sampled outputs. The sampling may be, for example, round robin sampling, and the number of channels K may be greater than the decimation factor M. The $x_0(m)$ through $x_{M-1}(m)$ sampled outputs are fed into a bank of filter blocks including filter block 0 36a, filter block 1 36b, and filter block M−1 36c. Each of filter blocks 36a, 36b through 36c provide β filter outputs. As shown, filter block 0 36a provides $y_{0,0}(m)$ through $y_{0,\beta-1}(m)$ filtered outputs, where m is a time index. The y filtered outputs are in the time domain. The (M)×(β) y filtered outputs from the bank of M filter blocks 36a, 36b through 36c are fed into a bank of β K-point FFT processors, including K-point FFT processor 0 38a, K-point FFT processor 1 38b, through K-point FFT processor β−1 38c. (K−M) zero inputs 40 are also fed to the bank of β K-point FFT processors 38a, 36b, through 38c. Each of the 0 to β−1 K-point FFT processors of the bank of β K-point FFT processors receives one of the 0 to β−1 y filtered outputs from each one of the M filter blocks 36a, 36b, and 36c, and receives K−M zero inputs from the (K−M) zero inputs 40, when K is greater than M. The bank of β K-point FFT processors 38a, 38b through 38c provide $\chi_{0,0}$, through $\chi_{K-1,\beta-1}$ transformed outputs. Each of the β K-point FFT processors 38a, 38b through 38c provide K transformed outputs $\chi_0$ through $\chi_{K-1}$ where K is the number of channels having respective frequency bands. That is, the first K-point FFT processor 0 38a provides $\chi_{0,0}(m)$ through $\chi_{K-1,0}(m)$, the second K-point FFT processor 1 38b provides $\chi_{0,1}(m)$ through $\chi_{K-1,1}(m)$, and K-point FFT processor β−1 38c provides $\chi_{0,\beta-1}(m)$ through $\chi_{K-1,\beta-1}(m)$ transformed outputs. Hence, there are (β)×(K) $\chi(m)$ transformed outputs. The (β)×(K) $\chi(m)$ transformed outputs are transform domain signals. The (β)×(K) $\chi(m)$ transformed outputs are fed into a post filter processing subsystem 42 for generating an output signal including K channelized output signals $X_0(m)$ through $X_{K-1}(m)$, where (m) is a time index. As such, the analyzer channelizes the complex input signal into K channelized outputs 44 over respective K frequency bands. A user signal may occupy one or more of the K frequency bands.

Referring to FIGS. 1 and 2, and more particularly to FIG. 2, each of the M filter blocks 36a, 36b, through 36c are referred to as a $j^{th}$ filter block, shown in FIG. 2, for receiving a $j^{th}$ commutator output 50 from the input commutator 30, such as the input commutator $x_0(m)$ output being an input to the $0^{th}$ filter block 36a. Each of the filter blocks 36a, 36b, through 36c includes a $j^{th}$ clockwise commutator 52 that is clocked by Mod β counter outputs $C_{0,0}$, $C_{0,1}$, through $C_{0,K-1}$ clocking signals for respectively providing $x_{j,0}(i_0)$, $x_{j,1}(i_0)$, through $x_{j,\beta-1}(i_0)$ $j^{th}$ sampled outputs. The β $j^{th}$ sampled outputs from the $j^{th}$ commutator 52 are respectively fed into β $q_{j,\overline{m0+0}}(i_0)$, $q_{j,\overline{m0+1}}(i_0)$, through $q_{j,\overline{m0+\beta-1}}(i_0)$ polyphase filters 56a, 56b, through 56c, for respectively providing $y_{j,\overline{m0+0}}(i_0)$, $y_{j,\overline{m0+1}}(i_0)$, through $y_{j,\overline{m0+\beta+1}}(i_0)$ polyphase filter outputs to the ring switch 58 then providing $y_{j,0}(m)$, $y_{j,1}(m)$, through $y_{j,\beta-1}(m)$ filtered outputs. Hence, each of the M filter blocks provides β filtered outputs.

Figure 3:
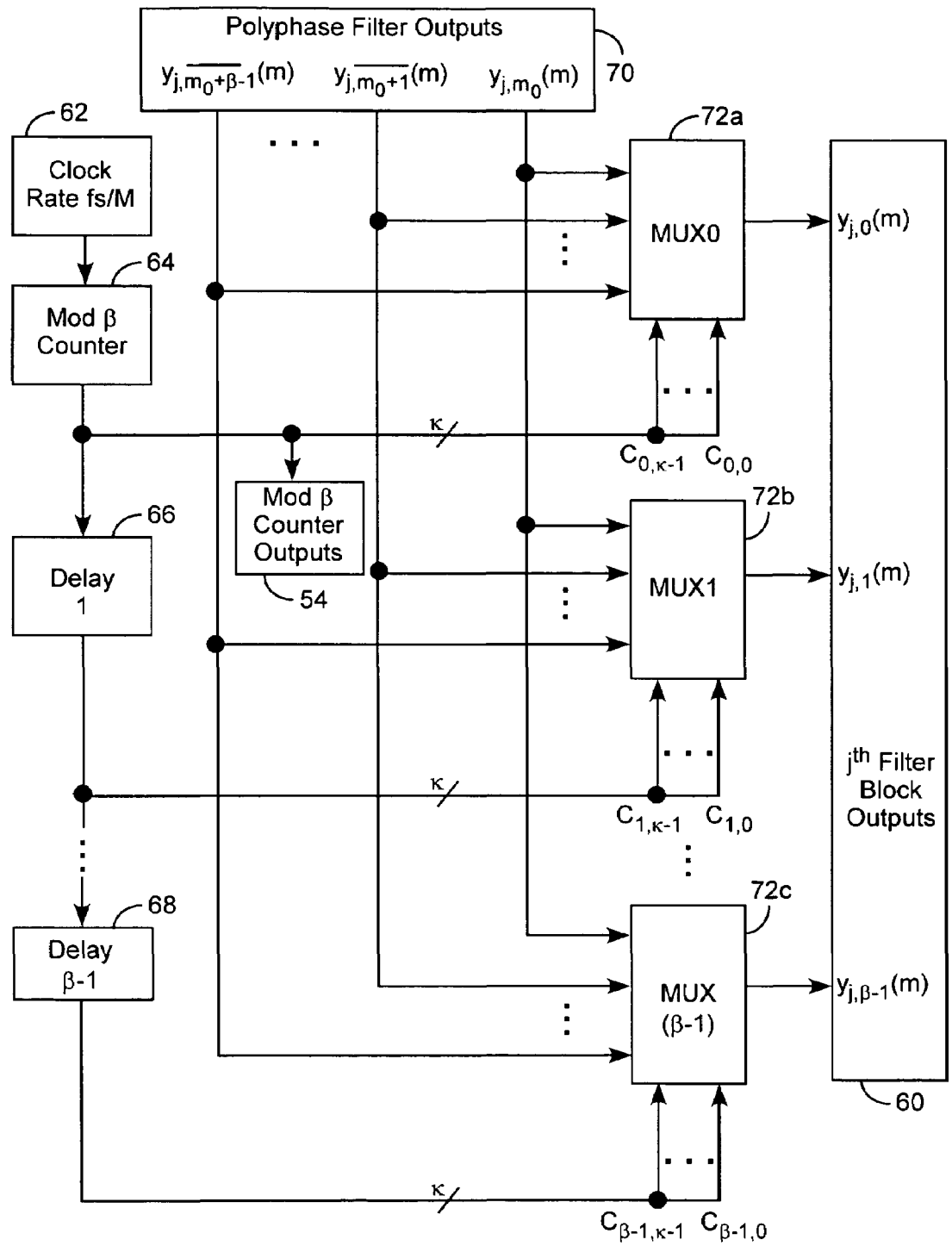
FIG. 3 is a block diagram of a ring switch.

Referring to FIGS. 1, 2, and 3, and more particularly to FIG. 3, the ring switch 58 generates a clock signal 62 at a rate of fs/M that is fed into a Mod β counter 64 for generating the Mod β counter outputs 54 at a $0^{th}$ delay time. The Mod β counter outputs are fed through successive β−1 delays 66 through 68 for providing a total of β counter outputs each having κ staggered clock signals $C_{0,\kappa-1}$ to $C_{0,0}$, $C_{1,\kappa-1}$ to $C_{1,0}$, through $C_{\beta-1,\kappa-1}$ to $C_{\beta-1,0}$.

The ring switch routes the $y_{j,\overline{m0+0}}(i_0)$, $y_{j,\overline{m0+1}}(i_0)$, through $y_{j,\overline{m0+\beta+1}}(i_0)$ polyphase filter outputs 70 to each of β MUX0, MUX1, through MUX(β-1) multiplexers 72a, 72b, through 72c, respectively receiving the $C_{0,\kappa-1}$ to $C_{0,0}$, $C_{1,\kappa-1}$ to $C_{1,0}$, through $C_{\beta-1,\kappa-1}$ to $C_{\beta-1,0}$ staggered clock signals. Each of β multiplexers 72a, 72b, through 72c multiplex the $y_{j,\overline{m0+0}}(i_0)$, $y_{j,\overline{m0+1}}(i_0)$, through $y_{j,\overline{m0+\beta+1}}(i_0)$ polyphase filter outputs as the $j^{th}$ filter block outputs 60 using the $C_{0,\kappa-1}$ to $C_{0,0}$, $C_{1,\kappa-1}$ to $C_{1,0}$, through $C_{\beta-1,\kappa-1}$ to $C_{\beta-1,0}$ staggered clock signals.

Figure 4:
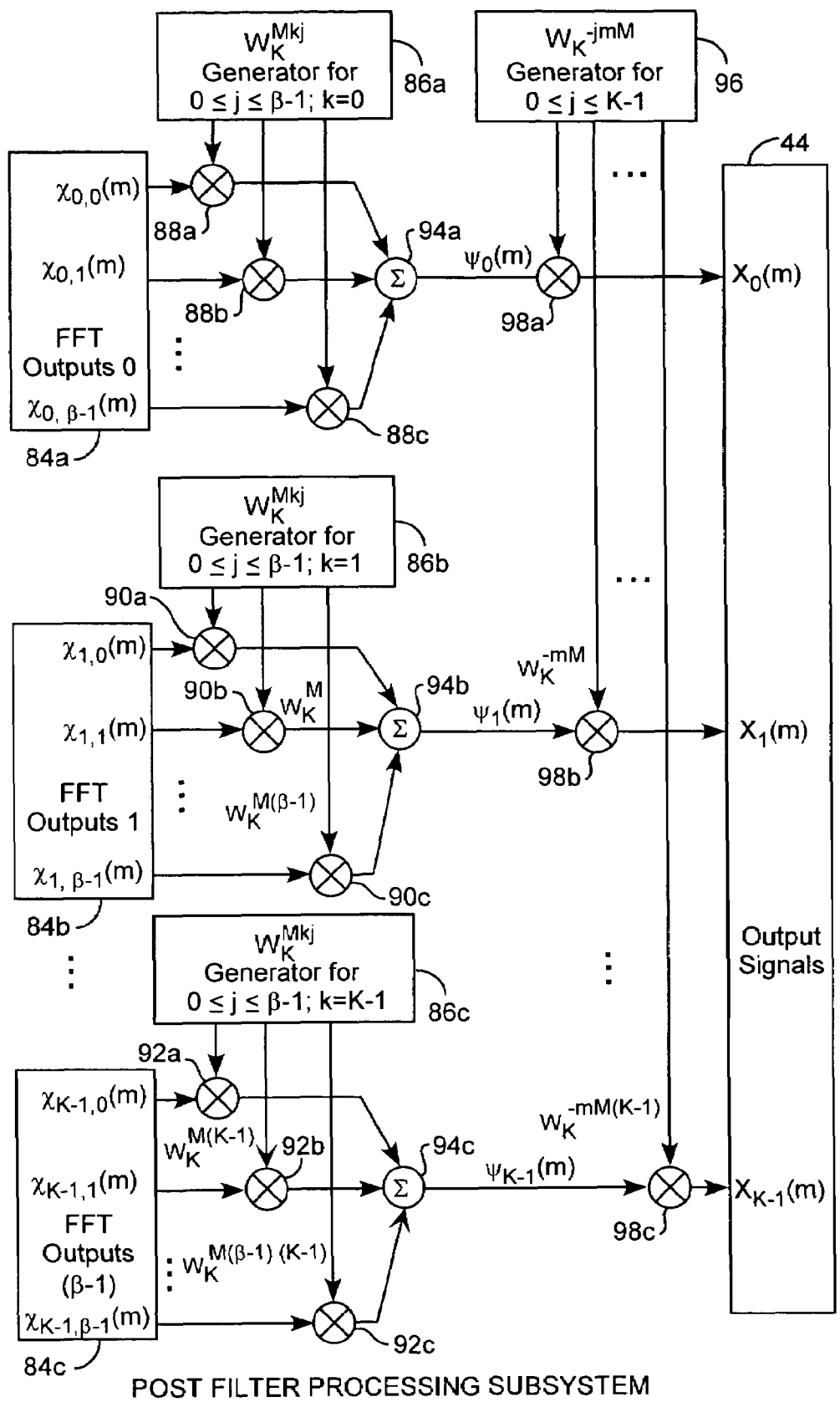
FIG. 4 is a block diagram of a post filter processing system.

Referring to FIGS. 1, 2, 3, and 4, and more particularly to FIG. 4, K sets of transformed outputs 84a, 84b, through 84c are respectively received from the β FFT processors 38a, 38b, through 38c. The set of $\chi_{0,0}(m)$, $\chi_{0,1}(m)$, through $\chi_{0,\beta-1}(m)$ transformed outputs 84a from the FFT processors 38a through 38c are mixed with a β number of $W^{Mkj}_K$ signals from a $W^{Mkj}_K$ generator 86a for $0 \leq j \leq \beta-1$ and k=0, respectively, using mixers 88a, 88b, through 88c, for generating a β set of $W^{M0j}_K$ mixed signals that are summed by a summer 94a to provide a $\psi_0(m)$ sum signal, as and while, the set of $\chi_{1,0}(m)$, $\chi_{1,1}(m)$, through $\chi_{1,\beta-1}(m)$ transformed outputs 84b from the FFT processors 38a through 38c are mixed with a $W^{Mkj}_K$ signals from another $W^{Mkj}_K$ generator 86b for $0 \leq j \leq \beta-1$ and k=1, respectively, using a β number of mixers 90a, 90b, through 90c, for generating a β set of $W^{M1j}_K$ mixed signals that are summed by a summer 94b to provide a $\psi_1(m)$ sum signal, as and while and through, the set Of $\chi_{K-1,0}(m)$, $\chi_{K-1,1}(m)$, through $\chi_{K-1,\beta-1}(m)$ transformed outputs 84c from the FFT processor 38a through 38c are mixed with a β number of $W^{Mkj}_K$ signals from a $W^{Mkj}_K$ generator 86c for $0 \leq j \leq \beta-1$ and k=K-1, respectively, using mixers 92a, 92b, through 92c, for generating a β set of $W^{M(K-1)}_K$ mixed signals that are summed by summer 94c to provide a $\psi_{K-1}(m)$ sum signal. The set of K $\psi_0(m)$, $\psi_1(m)$, through $\psi_{K-1}(m)$ signals are then mixed with a K number of $W^{-jmM}_K$ signals from a $W^{-jmM}_K$ generator 96 for $0 \leq j \leq K-1$. The $W^{-0mM}_K$ signal is mixed with the $\psi_0(m)$ sum signal, as and while, a $W^{-1mM}_K$ signal is mixed with the $\psi_1(m)$ sum signal, as and while and through, $W^{-(K-1)mM}_K$ signal is mixed with the $\psi_{K-1}(m)$ sum signal, for respectively generating the $X_0(m)$, $X_1(m)$, through $X_{K-1}(m)$ channelized output signals 44.

Figure 5:
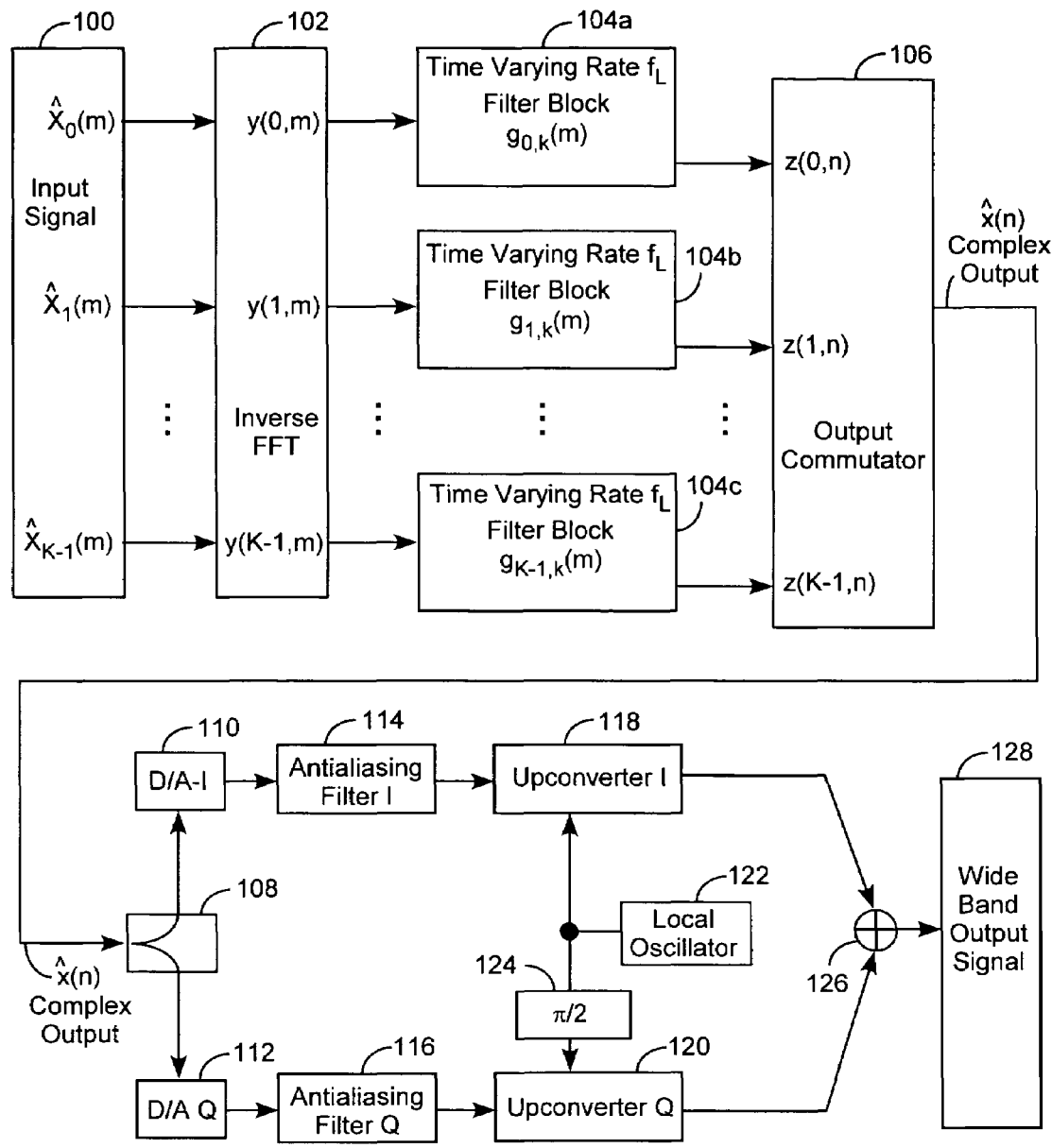
FIG. 5 is a block diagram of a generalized polyphase synthesizer.

Referring to FIG. 5, a generalized polyphase synthesizer receives K channelized inputs 100. The K channelized inputs $\hat{X}_0(m)$ through $\hat{X}_{K-1}(m)$ 100 may be the estimates of the $X_0(m)$, $X_1(m)$ through $X_1(m)$ channelized outputs 44 from the analyzer which outputs 44 are processed and switched through a multiple access communication system, not shown. The K channelized input 100 are fed into an inverse FFT 102 providing $y_0(m)$ through $y_{K-1}(m)$ inverse transformed outputs, where m is a time index, as K inverse transformed outputs. The K inverse transformed outputs are respectively fed into $g_{0,k}(M)$, $g_{1,k}(m)$ through $g_{K-1,k}(m)$ time varying filter blocks 104a, 104b, through 104c respectively. The K time varying filter blocks 104a, 104b, through 104c provide respective time varying filter outputs z(0,n), z(1,n), through z(K-1,n). The K time varying filter outputs are fed into an output commutator for generating a complex output signal $\hat{x}_n$. The complex output signal $\hat{x}_n$, in the digital domain is then split by a splitter 108 and fed in quadrature to inphase and quadrature digital to analog converters 110 and 112 providing digital inphase and quadrature signals to I inphase and Q quadrature antialiasing filters 114 and 116, respectively. The antialiasing filters 114 and 116 provide inphase and quadrature filter signal to inphase and quadrature upconverters 118 and 120 respectively. A local oscillator 122 provides an RF oscillator signal to the I inphase upconverter 118 and to a π/2 phase shifter for phase shifting the RF oscillator signal for upconverting the Q quadrature filter signal. The inphase and Quadrature upconverted signal are combined by an adder 126 to provide a wideband output signal 128. The wideband output signal 128 is a replica of the wideband input signal 10. Analog to digital conversion and upconverting are well known conventional signal modulation methods.

Figure 6:
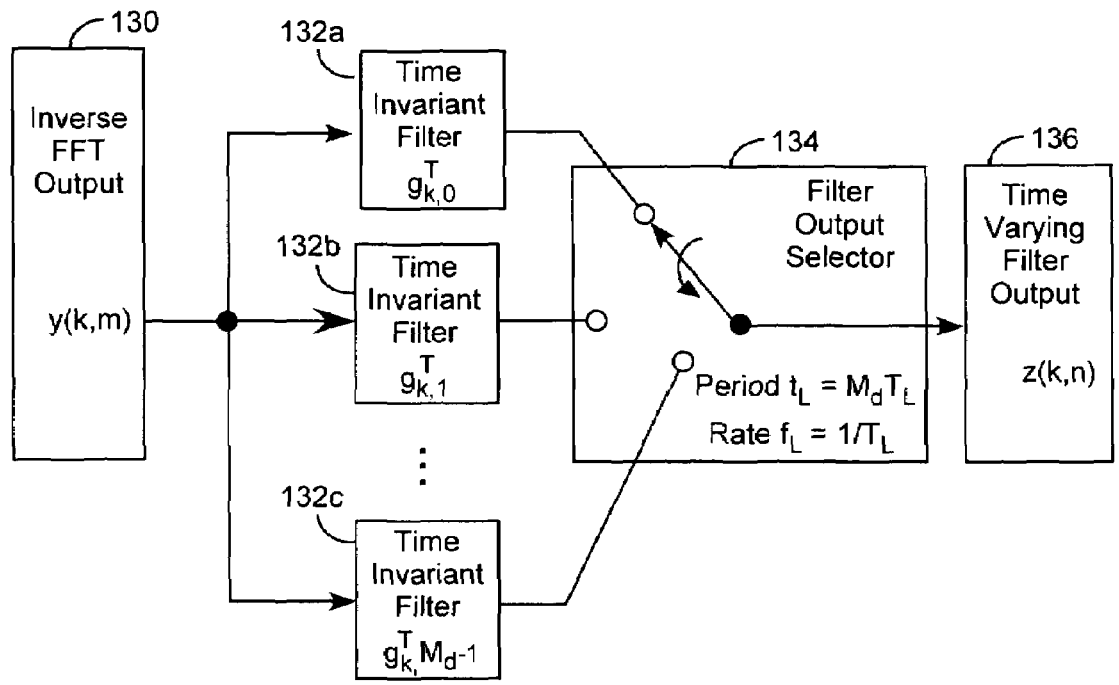
FIG. 6 is a block diagram of a time-varying filter block.

Referring to FIGS. 5 and 6, and more particularly to FIG. 6, a $k^{th}$ time varying filter block receives a $k^{th}$ inverse transformed output 130 that is fed into an $M_d$ number of $g_{k,0}^T$ time invariant filters 132a, 132b, through 132c providing a respective $M_d$ number of time invariant filter outputs that fed into a filter output selector 134. The filter output selector 134 in a round robin manner selects each of the time invariant filter outputs in turn at a rate of $1/T_L$. The set of the time invariant filter outputs are sampled over a time period $t_L$ where $t_L = M_d T_L$. The filter output selector 134 provides the z(k,n) time varying filter output 136.

Figure 7:
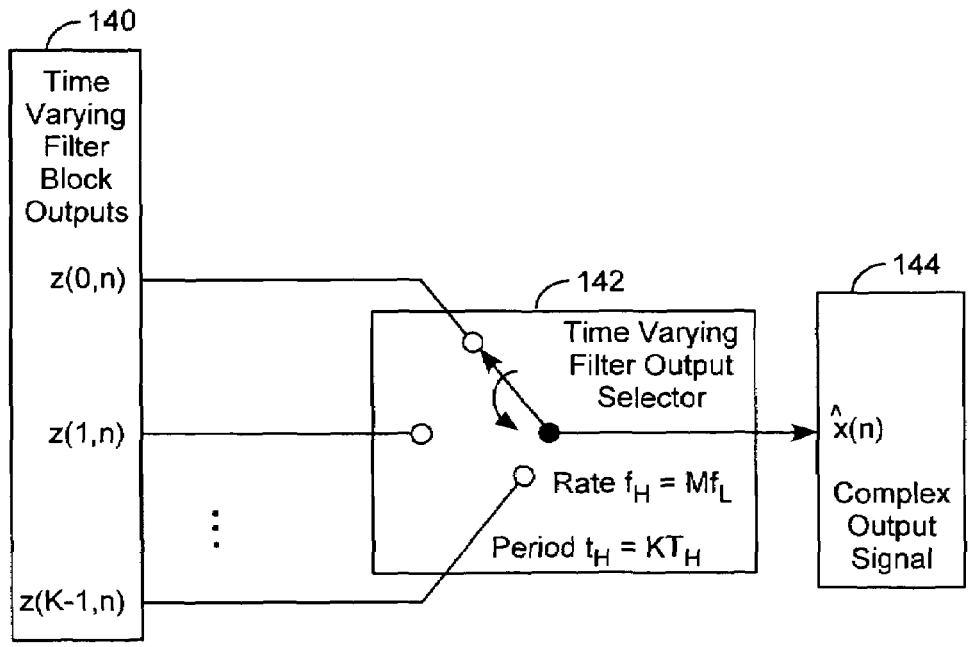
FIG. 7 is a block diagram of an output commutator.

Referring to FIGS. 5, 6, and 7, and more particularly to FIG. 7, the K set of z(0,n), z(1,n), through z(K-1,n) time varying filter outputs 140 from the respectively K blocks of time varying filter blocks 104a, 104b, through 104c are fed into the output commutator 106 for generating the complex output signal $\hat{x}(n)$ 144. The output commutator 106 feeds the z(0,n), z(1,n), through z(K-1,n) time varying filter outputs 140 into a time varying filter output selector 142 that samples each of the time varying filter outputs 140 in turn at a rate $f_H$ where $f_H = Mf_L$. All of the time varying filter outputs 140 are sampled over a sampling period of $t_H$ where $t_H = Kt_H$.

Referring to all of the figures, the generalized polyphase channelization system can be modeled by mathematical expressions. The implementation of the analyzer can be preferably obtained for the case of K>M. With $W_K = e^{j2\pi/K}$, the output of the $k^{th}$ analyzer channel may be expressed by $X_k(m)$ channel equations for k=0, 1, ..., (K-1).

$$X_k(m) = W_K^{-kmM} \sum_{n=-\infty}^{\infty} [h(mM-n)W_K^{k(mM-n)}] \cdot x(n)$$

$$X_k(m) = W_K^{-kmM} \cdot \sum_{j=0}^{L_0-1} h(j) W_K^{kj} x(mM-j)$$

In the $X_k(m)$ channel equation, the term $W^{-kmM}_K \cdot W^{-jmM}_k$ is the output of the $W^{jmM}_K$ generator 96 in FIG. 4, the term x(mM-j) is the $j^{th}$ sampled output of the input commutator 30 and the term h(j) denotes the $j^{th}$ component of the impulse response h of the prototype low pass filter for any integer j. The prototype low pass filter impulse response h specifies the desired shape of the frequency response about the center frequencies of the K channels achieved by the channelizer. The prototype low pass filter is a finite impulse response filter in the preferred embodiment and has only a finite number of terms h(j). Let $L_0$ denote the length of the impulse response vector so that h(j) is equal to zero for j values outside the interval $L_0-1 \geq j \geq 0$, and such that $L_0$ may be factorized into the product M×L, for some integer L where M is the decimation factor. Such a factorization can always be achieved by including a sufficient number of zero components at the end of the impulse response vector h, if necessary, without modifying the desired filter response. The segments of the impulse response vector h determine the impulse response of the polyphase filters 56a through 56c in FIG. 2. That is, the polyphase analyzer is based on a set of filter weight vectors $q_i$ that are defined by a $q_i$ vector equation $q_i = [h(i), h(M+i),$ $h(2M+i), \ldots, h((L-1)M+i)]^T$ for $i=0, 1, \ldots, M-1$. With $j=iM+\rho$ where j is the time index of the sampled complex input x to the input commutator 30, and, multiplying both sides of the channel equations by $W^{kmM}{}_K$, with $X_\rho(m)=x(mM-\rho)$ for $\rho=0, 1, \ldots, M-1$, and, for $m=0, 1, \ldots$, with m being an index for an input subsequence, results in the z component equations.

$$W_K^{kmM} X_k(m) = \sum_{\rho=0}^{M-1} z(\rho, m), \text{ where,}$$

$$z(\rho, k, m) = \sum_{i=0}^{L-1} h(iM + \rho) W_K^{k(iM+\rho)} x[(m-i)M - \rho]$$

Similarly, while using the expression for $z(\rho,k,m)$ for various values of integer $\rho$, an enhanced z component equation may be obtained for $\rho=0, 1, \ldots, (M-1)$.

$$z(\rho, k, m) = \sum_{i=0}^{L-1} q_\rho(i) W_K^{(iM+\rho)k} x_\rho(m-i)$$

In order to define a polyphase channelization operation, let $M_0=\gcd(M,K)$, where gcd denotes the greatest common divisor, then for some integers $\alpha$ and $\beta$, $M=\alpha M_0; K=\beta M_0; M_0=\gcd(M,K)$. With $L=\beta\gamma$ for some integer $\gamma$, the condition $L=\beta\gamma$ can be satisfied with zero padding of the impulse response h, as necessary, the summation in enhanced z component equation for the case of $\rho=0$, is now decomposed in to $\beta$ sums each having $\gamma$ terms as in a $z(0,k,m)$ equation.

$$z(0, k, m) = \sum_{\eta=0}^{\beta-1} \sum_{i=0}^{\gamma-1} q_0(i\cdot\beta + \eta) x_0[m - (i\beta + l)] W_K^{kM(i\beta+\eta)}$$

With the observation that
$W^{kM\beta}{}_K = W^{k(\alpha M_0)\beta}{}_K = W^{k\alpha(M_0\beta)}{}_K = W^{k\alpha K\beta}{}_K = 1$, for any and with the definitions of $q_{j,\eta} \equiv q_j(\beta i+\eta)$ for $i=0, 1, \ldots, (\gamma-1)$, for $\eta=0, 1, \ldots, (\beta-1)$, and for $j=0, 1, \ldots, (M-1)$, the expression of the $z(0,k,m)$ equation may be rewritten as semifinal $z(0,k,m)$ equations.

$$z(0, k, m) = \sum_{\eta=0}^{\beta-1} y_{0,\eta}(m) W_K^{kM\eta}, \text{ where,}$$

$$y_{0,\eta}(m) = \sum_{i=0}^{\gamma-1} q_{0,\eta}(i) x_0(m - i\beta - \eta)$$

Similarly the expression for the enhanced z component equation may be rewritten as semifinal $z(\rho,k,m)$ equations $$z(j, k, m) = W_K^{kj} \sum_{\eta=0}^{\beta-1} y_{j,\eta}(m) W_K^{kM\eta}, \text{ where,}$$

$$y_{j,\eta}(m) = \sum_{i=0}^{\gamma-1} q_{j,\eta}(i) x_j(m - i\beta - \eta)$$

The semifinal $z(j,k,m)$ equation can be then expressed by a $z(j,k,m)$ parenthetical summation.

$$\sum_{j=0}^{M-1} z(j, k, m) = \sum_{\eta=0}^{\beta-1} \left( \sum_{j=0}^{M-1} y_{j,\eta}(m) W_K^{kj} \right) W_K^{kM\eta}$$

By denoting the parenthetical summation as $\chi_{k,\eta}(m)$, the final $z(j,k,m)$ equation can then be expressed as a $\psi_k(m)$ summation equation.

$$\psi_k(m) \equiv \sum_{j=0}^{M-1} z(j, k, m) = \sum_{\eta=0}^{\beta-1} \chi_{k,\eta}(m)(W_K^M)^{k\eta} \text{ where}$$

$$\chi_{k,\eta} = \sum_{j=0}^{M-1} y_{j,\eta}(m) W_K^{kj}$$

Finally, the z component equation for the channelized signals $X_k(m)$ can be expressed by final $X_k(m)$ channel equation using the summation term $\psi_m(m)$ for $k=0, 1, \ldots, (K-1)$.

$$X_k(m) = W_K^{-kmM} \cdot \psi_k(m)$$

The summation term $\psi_k(m)$ can be computed from $\psi_k(m)$ summation equation, as implemented in the analyzer and shown as the outputs of the adders 94a through 94c in FIG. 4. In turn $\chi_{k,\eta}$ in the $\psi_k(m)$ summation equation for k between 0 and K−1 and $\eta$ between 0 and $(\beta-1)$ are implemented by the K-point FFT processors with their K−M inputs equal to zero as shown in FIG. 1 so as to achieve the computational advantage of the FFT processors 38a through 38c. The implementation of $z(j,k,m)$ equation has the variables $y_{j,\eta}(m)$ that are computed by filter blocks 36a, 36b, through 36c operating on the inputs $X_j(m)$ for $j=0, 1, \ldots, M-1$. The input to the filter blocks 36a, 36b, through 36c are provided by the input commutator 30 which operates on the sampled complex input x(n) in FIG. 1. In FIG. 3, $m_0$ represents the value of integer m modulo $\beta$, and, thus takes the values $0, 1, \ldots, (\beta-1)$. That is, $m=m_0+i_0\beta$ for some integer $i_0 \geq 0$. With $\eta=m_0$ substituted into the semifinal $z(\rho,k,m)$ equation, $y_{j,m_0}$ polyphase filter equations can be expressed by summations.

$$y_{j,m_0}(m) = \sum_{i=0}^{\gamma-1} q_{j,m_0}(i) x_j((i_0 - i)\beta)$$

$$y_{j,m_0}(m) = \sum_{i=0}^{\gamma-1} q_{j,m_0}(i) x_{j,0}(i_0 - i) = x_{j,0}(i_0) \otimes q_{j,m_0}(i_0)$$

In the polyphase filter equations $\otimes$ denotes convolution, and $x_{j,k}(i)=x_j(i\beta-k)$ is one of subsequences of $x_j(m)$. Similarly, $y_{j,\overline{m_0+\alpha}}(i_0)=x_{j,\alpha}(i_0) \otimes q_{j,\overline{m_0+\alpha}}(i_0)$, for $\alpha=1, 2, \ldots, (\beta-1)$.

The bar over the $(m_0+\alpha)$ subscript represents modulo $\beta$ value of the index $(m_0+\alpha)$. FIG. 2 shows the commutator operation for the $j^{th}$ commutator 52 operating on the input $x_j(m)$ yielding the subsequences $x_{j,\alpha}(i_0)$ for $\alpha=0, 1, \ldots, (\beta-1)$ and $i_0=0, 1, 2, \ldots$, as defined by $m=m_0+i_0\beta$. In FIG. 2, the $x_{j,\alpha}(i_0)$ sequences are input to the polyphase filters 56a, 56b, through 56c, having respective impulse response functions given by $q_{j,\overline{m0+\alpha}}(i_0)$ for $\alpha=1, 2, \ldots, (\beta-1)$ where $\overline{m0+\alpha}$ denotes modulo $\beta$ value of $(m0+\alpha)$ and thus takes integer values between 0 and $(\beta-1)$. The $y_{j,\overline{m0+0}}(i_0), y_{j,\overline{m0+1}}(i_0)$, through $y_{j,\overline{m0+\beta+1}}(i_0)$ polyphase filter outputs are made available to the ring switch 58 for ordering the outputs as $y_{j,0}(m), y_{j,1}(m)$, through $y_{j,\beta-1}(m)$ filtered outputs. The ring switch 58 generates $\beta$ number of staggered clocking signals for reordering the polyphase filter outputs through the multiplexers 72a, 72b, through 72c. The clocking signals are represented in terms of $\kappa$ number of bits required to represent mod $\beta$ counter output, where $\kappa=[\log_2(\beta)]$. The ring switch uses the mod $\beta$ counter 64 and series of delays 66 through 68 that can be implemented as a serial shift register of length $\beta$ providing $\beta$ delayed versions of the Mod counter $\beta$ sequence.

The clocking signals $C_{0,\kappa-1}, C_{0,\kappa-2}, \ldots, C_{0,0}$ represent the states of the mod $\beta$ counter 64 counting in the order of $(\beta-1), (\beta-2), \ldots, 1,0$ and represents a decimal number between 0 and $(\beta-1)$ in BCD form. The outputs of various delays 66 through 68 therefore provide staggered phased clock signals $C_{0,\kappa-1}, C_{0,\kappa-1,0}$. When the contents $C_{0,\kappa-1}, C_{0,\kappa-2}, \ldots, C_{0,0}$ represent decimal 0, the output $\{C_{1,\kappa-1}, C_{1,\kappa-2}, \ldots, C_{1,0}$ of first delay block 66 represent decimal 1, and the output $C_{\beta-1,\kappa-1}, C_{\beta-1,k-2}, \ldots, C_{\beta-1,0}$ of $(\beta-1)$ th delay block 68 represents $(\beta-1)$. Thus, when $m_0=0$, the outputs of the counter 64 is equal to 0 while the delays 66 through 68 provide the consecutive delayed outputs equal to $1, 2 \ldots, (\beta-1)$, respectively. Thus, the output of MUX0 72a, is $y_{j,m_0}=y_{j,0}$, with the output of the MUX1 72b is $Y_{j,m_0}=y_{j,\beta-1}$, and through, the output of MUX$(\beta-1)$ is $y_{j,m_0}=y_{j,\beta-1}$, and so on, for providing the correct sequencing of each of the $j^{th}$ filter block outputs 60. At the next clock cycle $m_0=1$, the inputs to the ring switch 58 are $y_{j,1}(m), y_{j,2}(m), \ldots, y_{j,0}(m)$. The contents of the Mod $\beta$ counter 54 and the consecutive delays 66 through 68 represent the decimal numbers $(\beta-1), 0, 1, 2, \ldots, (\beta-2)$, respectively. Thus, the ring switch outputs, that are the $j^{th}$ filter block outputs 60, are in the correct sequence $y_{j,0}(m), y_{j,1}(m), \ldots, y_{j,\beta-1}(m)$, for all the time, for generating the channelized output $x_j(m)$ 44, that can be then output to the user.

The synthesizer inputs 100 in FIG. 5 are K channelized signal inputs $\hat{X}_0(m)$ through $\hat{X}_{K-1}(m)$. In the preferred implementation of the synthesizer, the $\hat{X}_k(m)$ input signals, for $k=0, 1, \ldots, K-1$ are the complex baseband signals. For the case of equispaced channels, where $\omega=2\pi k/K$, the synthesizer complex output signal $\hat{x}(n)$ 144 may be expressed by a complex output equation $$\hat{x}(n) = \sum_{m=-\infty}^{\infty} f(n-Mm)\frac{1}{K}\sum_{k=0}^{K-1} \hat{X}_k(m)W_K^{kn} \text{ where } W_K = e^{j2\pi/K}$$

Equivalently, the complex output signal $\hat{x}_n$ expression may be rewritten in terms of inverse transformed output $y(n,m)$ in an expanded complex output signal equation.

$$\hat{x}(n) = \sum_{m=-\infty}^{\infty} f(n-mM)y(n,m)$$

-continued $$\hat{x}(n) = \sum_{m=-\infty}^{\infty} f(n+mM)y(n,-m), \text{ where}$$

$$y(n,m) = \frac{1}{K}\sum_{k=0}^{K-1} \hat{X}_k(m)W_K^{kn}$$

For any fixed value of m, $y(n,m)$ is periodic with respect to the index n with a period K. In the expanded complex output signal equation, the term $f(j)$ for any integer j denotes the $j^{th}$ component of the impulse response f of the prototype low pass filter for any integer j. The prototype low pass filter impulse response f specifies the desired shape of the frequency response about the center frequencies of the K channels achieved by the channelizer synthesizer. The prototype low pass filter is a finite impulse response filter in the preferred embodiment and has only a finite number of terms $f(j)$. Let $L_0$ denote the length of the impulse response vector so that $f(j)$ is equal to zero for j values outside the interval $L_0-1 \geq j \geq 0$, and such that $L_0$ may be factorized into the product $M \times L$, for some integer L where M is the decimation factor. Such a factorization can always be achieved by including a sufficient number of zero components at the end of the impulse response vector f, if necessary, without modifying the desired filter response. The impulse response vectors of the synthesizer time-varying filter blocks 104a, 104b, through 104c and denoted by $g_{0,k}(m), g_{1,k}(m)$, through $g_{K-1,k}(m)$ in FIG. 5 are defined in terms of the segments of the impulse response vector f denoted by $\bar{g}_0, \bar{g}_1, \ldots, \bar{g}_{M-1}$ and obtained by the $\bar{g}_\eta$ vector equation $\bar{g}_\eta = [f(\eta) \; f(M+\eta), \ldots, f((L-1)M+\eta)]^T$ for $\eta=0, 1, \ldots, (M-1)$. The relationship between the time-varying impulse response vectors $g_{0,k}(m), g_{1,k}(m)$, through $g_{K-1,k}(m)$ in FIG. 5 and the vectors $\bar{g}_\eta$ for $\eta=1,2, \ldots, K-1$ will become clear from the following description. For the case when the coefficients $f(j)$ of the impulse response of the synthesizer prototype filter are zero for j values outside the interval $L_0-1 \geq j \geq 0$, the complex output equation may be expanded as $\hat{x}_n = f(n)y(n,0) + f(n+M)y(n,-1) + \ldots + f(n+(L-1)M)y(n,-L+1)$. With the transformed outputs represented in terms of the inverse transformed output vector $Y(n,0) = [y(n,0) \; y(n,-1) \ldots y(n,-(L-1))]^T$ and with $\bar{g}_n^T = [f(n) \; f(M+n) \ldots f((L-1) M+n)]$ for $n=0, 1, 2 \ldots, (M-1)$, for the convenience of describing the requisite mathematical operations and where T denotes the matrix transpose operation, it follows that $\hat{x}_n = \bar{g}_n^T Y(n,0)$ for $n=0, 1, \ldots, (M-1)$, and that $\hat{x}(M+n) = \bar{g}_n^T Y(M+n,1)$ for $n=0, 1, \ldots, (M-1)$ and in general, $\hat{x}(jM+n) = \bar{g}_n^T Y(jM+n,j)$ for $n=0, 1, \ldots, (M-1)$ and for $j=0, 1, \ldots$, where $Y(n,j) = [y(n,j) \; y(n,j-1) \ldots y(n,-(L-1-j))]^T$ for $n=0, 1, 2 \ldots; j=0, 1, \ldots$, and so on. From the fact that $y(n,m)$ is periodic with respect to the index n with a period of K for any fixed value of m, that is, $y(n+\lambda K,m) = y(n,m)$ for any integer $\lambda$, the synthesizer output signal equation may be rewritten in terms of the $\bar{g}$ array coefficients in $\bar{g}$ synthesizer output equations, such as, $\hat{x}(n) = \bar{g}_n^T Y(n,0)$ for $n=0, 1, \ldots, (M-1)$, and, $\hat{x}(M+n) = \bar{g}_n^T Y(M+n,1)$ for $n=0, 1, \ldots, (K-1-M)$, and the sequence, $\hat{x}(K) = \bar{g}_{K-M}^T Y(0,1), \hat{x}(K+1) = \bar{g}_{K-M+1}^T Y(1,1)$ and so on. As the index n of vector $\bar{g}_n$ varies from 0 to (M-1), and the first argument of Y varies over the range 0 to (K-1), the synthesizer output signal may be expressed in the compact form, that is, $\hat{x}(jM+n) = \bar{g}_n^T Y([jM+n]_{modK}, j)$ where $j=0, 1, \ldots$, and $n=0, 1, \ldots, (M-1)$, and where $[jM+n]_{modK}$ denotes the nonnegative integer obtained as remainder in the integer division of $(jM+n)$ by K.

With F=lcm(M,K) where lcm(M,K) denotes the least common multiple (lcm) of M and K, then define $K_d$ and $M_d$ by $K_d$=F/M and $M_d$=F/K. To obtain $[jM+n]_{modK}$ for all possible values of j and n, the equation $[jM+n]_{modK}$=p is solved for p=0, 1, ..., K−1 and for all possible values of j and n where the value of n is computed modulo M. In particular, for the case of p equal to 0 all possible solutions j and n are obtained for the equation jM+n=rK for all possible integers r. A complex output signal solution table illustrates the computation of n and j values for the case of M=24 and K=32 for the expanded complex output signal equation mod M.

Complex Output Signal Solution Table

| r | j | n |
|---|---|---|
| 0 | 0 | 0 |
| 1 | 1 | $[K - M]_{modK}$ |
| 2 | 2 | $[2(K - M)]_{modK}$ |
| 3 | 3 | $[3(K - M)]_{modK}$ |
| . | . | . |
| . | . | . |
| . | . | . |
| $M_d - 1$ | $M_d - 1$ | $[(M_d - 1)(K - M)]_{modK}$ |
| $M_d$ | $M_d$ | 0 |

The last entry in the complex output signal table follows from the equations F=lcm(M,K) $K_d$=F/M and $M_d$=F/K. With $M_d$(K−M)=($K_d$−$M_d$)(M)=0 modulo M, and the equation [jM+n]=rK has only $M_d$ distinct values for n as given by the last column of the complex output signal solution table, excluding the last $M_d$ by $M_d$ by 0 row. For example, with M=24 and K=32, $K_d$=4 and $M_d$=3. The $M_d$=3 distinct values of n are 0, 8 and 16. In the same manner the equation $[jM+n]_{modK}$=1 has $M_d$ distinct solutions for n equal to 1, (K−M+1), ..., $[(M_d−1)(K−M)+1]$ values evaluated modulo K. For the case of M=24 and K=32, the $M_d$ distinct solutions for n of the equation $[jM+n]_{modK}$=1 are equal to 1, 9 and 17. In this manner the values of n mod M satisfying $[jM+n]_{modK}$=p for p=0, 1, ..., (K−1) may be evaluated. For example, for p=31 the distinct values of n modulo 24 are equal to 7, 15 and 23. The $M_d$ distinct solutions for n mod M of the equation $[jm+n]_{modK}$=p for p=0, 1, ..., (K−1) are denoted by the pairs (p,0),(p,1), ..., (p,$M_d$−1). In the computation of $\hat{x}$(jM+n) from the equation $\hat{x}(jM+n)=\bar{g}_n^T Y([jM+n]_{modK},j)$ for j=0, 1, ... and n=0, 1, ..., M−1, whenever $[jM+n]_{modK}$=p for any specific integer p in the range 0 to (K−1), the index n of the vector $\bar{g}_n^T$ will take values (p,0),(p,1),...,(p,$M_d$−1) in a cyclic manner. As Y(p,m)=[y(p,m) y(p,m−1) ... y(p,−(L−1−m))]$^T$ for m=0,1,2...; p=0, 1, ..., K−1, is comprised of the present and (L−1) past values of the y(p,m) output of the inverse FFT 102 in FIG. 5 for p=0, 1, ..., K−1, the product $\bar{g}_{p,i}^T Y(p,m)$ for i=0, 1, ..., $M_d$−1 is implemented in FIG. 5 by inputting the y(p,m) output of the inverse FFT 102 to the time varying filter with respective impulse response $\bar{g}_{p,i}^T$ for p=0, 1, ..., K−1 and i=0, 1, ..., $M_d$−1. Thus the y(0,m) output of the inverse FFT 102 is input to the time varying filter block 104a with time varying impulse response given by vectors $g_{0,0}$, $g_{0,1}$, ..., $g_{0,M_d-1}$ sequentially in time, the y(1,m) output of the inverse FFT 102 is input to the time varying filter block 104b with time varying impulse response given by vectors $g_{1,0}$, $g_{1,1}$, ..., $g_{1,M_d-1}$, sequentially in time, and so on, the y(K−1, m) output of the inverse FFT 102 is input to the time varying filter block 104c with time varying impulse response given by vectors $g_{K-1,0}$, $g_{K-1,1}$, ..., $g_{K-1,M_d-1}$, sequentially in time, as in FIG. 5.

FIG. 6 shows in a more explicit fashion the sequencing of the tap weight vectors $g_{p,0}$, $g_{p,1}$, ..., $g_{p,M_d-1}$ by inputting the inverse FFT output 130 y(k,m) to $M_d$ number of time-invariant filters 132a through 132c with their respective tap weight vectors equal to $g_{k,0}$, $g_{k,1}$, ..., $g_{k,M_d-1}$. In FIG. 6, the filter output selector 134 rotates through $M_d$ taps in a cyclical manner. The output 136 of the filter output selector 134 is denoted by z(k,n) wherein n denotes time index.

Similarly the output of other time-varying filter blocks 104a, 104b, through 104c, similar to that of FIG. 6 are denoted by z(0,n), z(1,n), ..., z(K−1,n) for the case of p=1, 2, ..., (K−1) respectively with $[jM+n]_{modK}$=p. The term (jM+n) is the time index for the synthesizer $\hat{x}$ complex output and the mod K operation is effectively performed by a K tap output commutator 106 in FIG. 5 by selecting one out of the K time-varying filter block outputs z(0,n), z(1,n), ..., z(K−1,n) in a cyclic manner. FIG. 7 shows the details of the output commutator 106 of FIG. 5. The term $f_H$ is the sample rate of the time varying filter output selector 142 at the synthesizer $\hat{x}$ complex output and is equal to $Mf_L$ where $f_L$ is the sample rate of channels at the synthesizer input. In the time duration of $T_L$=1/$f_L$, there are K input samples processed by the inverse FFT 102 and the time-varying filter blocks 104a, 104b, through 104c, as both the inverse FFT processor 102 and the filter blocks 104a, 104b, through 104c operate at a rate of $f_L$. However, only M samples are read out by the commutator 106 in the $T_L$ duration thus giving the synthesizer output rate at $f_H$=$Mf_L$ as desired. All of K samples at the output of K filter blocks 102a, 102b, through 102c are not utilized as there is an inherent redundancy in various outputs of the filters with inputs Y(p,n) for p=0, 1, ..., (K−1); n=0, 1, .... Implementation of the expanded complex output signal equation achieved by the inverse FFT processor 102 having outputs that are y(n,m) and combining the FFT processor with the time varying polyphase filter blocks 102a, 102b, through 102c, results in the preferred time varying polyphase implementation.

The filtering operation in the time varying polyphase filter blocks 102a, 102b, through 102c in the FIG. 5 is performed with the tap weights vector $g_{p,j}$(m) for p=0, 1, ..., (K−1) and j=0, 1, ..., ($M_d$−1). There are only M number of distinct tap vectors that are subarrays of the filter f coefficient array, and $g_{p,j}$ is equal to one of these distinct vectors $\bar{g}_n$, with the sequence established according to the last column of the complex output signal solution table for p=0. For p>0, the n indices of the $g_n$ vectors are obtained by adding p to the n values of table 1 and taking mod M value of the result. The vectors $g_n$ indices table lists explicitly the index of the vector $g_n$ corresponding to the pair of indices p and j of any weight vector $g_{p,j}$ for various values of p=0, 1, ..., (K−1) and j=0, 1, ..., ($M_d$−1) for the case of K=32 and M=24 with $M_d$=3.

Vectors $g_n$ Indices Table

| j | \p 0 | 1 | 2 | 3 | 4 | 5 | 6 | 7 | 8 | 9 | 10 | 11 | 12 | 13 | 14 | 15 |
|---|---|---|---|---|---|---|---|---|---|---|----|----|----|----|----|----|
| 0 | 0 | 1 | 2 | 3 | 4 | 5 | 6 | 7 | 8 | 9 | 10 | 11 | 12 | 13 | 14 | 15 |
| 1 | 8 | 9 | 10 | 11 | 12 | 13 | 14 | 15 | 16 | 17 | 18 | 19 | 20 | 21 | 22 | 23 |
| 2 | 16 | 17 | 18 | 19 | 20 | 21 | 22 | 23 | 0 | 1 | 2 | 3 | 4 | 5 | 6 | 7 |

| j | \p 16 | 17 | 18 | 19 | 20 | 21 | 22 | 23 | 24 | 25 | 26 | 27 | 28 | 29 | 30 | 31 |
|---|---|---|---|---|---|---|---|---|---|---|----|----|----|----|----|----|
| 0 | 16 | 17 | 18 | 19 | 20 | 21 | 22 | 23 | 0 | 1 | 2 | 3 | 4 | 5 | 6 | 7 |
| 1 | 0 | 1 | 2 | 3 | 4 | 5 | 6 | 7 | 8 | 9 | 10 | 11 | 12 | 13 | 14 | 15 |
| 2 | 8 | 9 | 10 | 11 | 12 | 13 | 14 | 15 | 16 | 17 | 18 | 19 | 20 | 21 | 22 | 23 |

The implementation of the time-varying filter blocks 104a, 104b, through 104c of FIG. 5 are shown in FIG. 6 with $M_d$ time-invariant filters 132a through 132c each with input 130. Only one of the outputs of the time-invariant filters 132a through 132c is selected at any given time instance by the filter output selector 134 in a sequential manner. In practice, the $k^{th}$ filter block is implemented as a single filter having a coefficient vector at time k equal to $g_{p,k}$ which in turn is equal to one of the $\bar{g}_n$ with the correspondence between the indices k,p and n given by the vectors $g_n$ indices table for the example case of K=32 and M=24. These coefficient vectors $g_n$ may be stored in a read only memory, not shown, and read from the ROM in a sequence dictated by the vectors $g_n$ indices table for the case of K=32 and M=24. For example, one ROM may store all of the 24 filter $g_n(m)$ coefficients which are read sequentially but with different phase in mod 3 cycles, i.e., in the first cycle the indices of the K filter weight vectors are given by the first row of the vector $g_n$ index table and are equal to 0,1, . . . ,23,0,1 . . . ,7, followed by the second cycle with sequence 8,9, . . . ,23,0,1, . . . ,15, . . . , and so on.

The number of computations for the generalized polyphase channelizer may be estimated by the $M_{PDFT}$ multiplication equation.

$$M_{PDFT} = 2w\left[\frac{\left[\frac{2}{3}\log[1/(10\delta_1\delta_2)]\right]}{(w-2B)} + 4\beta\log_2(K)\right]$$

In the $M_{PDFT}$ multiplication equation the first term in the sum within the outermost bracket represents the computational requirements of the filter blocks 36a through 36c, while the second term represents the forward FFT 38a through 38c computational requirements. For the example of K=32 and M=24, β is equal to 4. In situations where the first term in the sum within the outermost bracket is dominant, the computational requirements of the generalized channelizer are practically same as for case where M=K. When the second log term is dominant, the computational requirements still increase linearly with $\log_2(K)$ as for the standard case, however with the coefficient of proportionality increased by a factor of β compared to the standard case. The generalized polyphase channelization system computational requirements for the case when the number of channels K is not integrally related to the decimation factor M of the channelizer is linear in $\log_2(K)$ and affords a practical implementation.

The invention is directed to a generalized polyphase channelizer having an analyzer that includes a bank of M time-varying branch filter blocks and a bank of βFFT processors. Each of the $j^{th}$ filter blocks in turn includes a $j^{th}$ commutator followed by a set of β number of time-varying filters and a ring switch. Each of the M filter blocks has β outputs that are processed by a set of β number of K-point FFT processors. The weighted sums of the FFT processors are the channelizer outputs. The generalized synthesizer includes a K-point inverse FFT processor followed by a set of time-varying filters whose outputs are input to an output commutator. The output commutator output is the desired synthesizer output. The sequencing of filter weight vectors is determined by the ratio of the number of channels K and the decimation factor M. The generalized polyphase channelizer can digitally analyze and synthesize multichannel signals even for the case when the number of channels K is not integrally related to the decimation factor M as applies, for example, to the case when there is overlap among adjacent channel passbands particularly useful for user signal allocated to multiple frequency passbands. The generalized polyphase channelizer enables application where the number of channels K is greater than the decimation factor M while retaining the computational efficiency of increasing linearly with $\log_2(K)$. The generalized polyphase channelizer is particularly useful for wideband and space based systems where the computational requirements is an important factor in determining the feasibility of the overall system design in terms of power, weight, size, and cost requirements. The invention should have broad market covering fields of digital signal processing and communications especially for systems involving broadband signals. Those skilled in the art can make enhancements, improvements, and modifications to the invention, and these enhancements, improvements, and modifications may nonetheless fall within the spirit and scope of the following claims.

What is claimed is:

1. A system for receiving a complex signal comprising K channelized input signals and for respectively providing K channelized output signals, the system comprising, an input commutator for sampling the complex signal at a sampling rate of fs modulo M for decimating the complex signal by a decimation factor M to provide M sampled outputs, a bank of M filter blocks for respectively filtering the M sampled outputs and for respectively generating β filtered outputs as (β)×(M) filtered outputs, a bank of β FFT processors for transforming the (β)×(M) filter outputs into (β)×(K) transformed outputs, and a subsystem for processing the (β)×(K) transformed outputs into the K channelized output signals wherein, M is an integer, K is an integer, β is an integer, β is greater than one, K is greater than M, β is equal to K divided by the greatest common divider of K and M, and The FFT processors are K-point FFT processors.

2. The system of claim 1 further for receiving a wideband input signal, the system further comprising, a downconverter for downconverting the wideband input signal into analog inphase and quadrature input signals, analog to digital converters for converting the analog inphase and quadrature input signals into digital inphase and quadrature input signals, and a combiner for combining in the digital domain the digital inphase and quadrature input signals into the complex input signal.

3. The system of claim 1 further comprising, an inverse FFT for inversely transforming the K channelized output signals into K inverse transformed signals, a bank of K time varying filter blocks for time varying filtering of the K inverse transformed signals into K time varying filtered outputs, and an output commutator for combining the K time varying filtered outputs into a complex output signal.

4. The system of claim 1 further for providing a wideband output signal, the system further comprising an inverse FFT for inversely transforming the K channelized output signals into K inverse transformed signals, a bank of K time varying filter blocks for time varying filtering of the K inverse transformed signals into K time varying filtered outputs, an output commutator for combining the K time varying filtered outputs into a complex output signal, a splitter for splitting in the digital domain the complex output signal into digital inphase and quadrature output signals, digital to analog converters for converting the digital inphase and quadrature output signals into analog inphase and quadrature output signals, and an upconverter for upconverting the analog inphase and quadrature output signals into a wideband output signal.

5. The system of claim 1 wherein,

M and K are both greater β.

6. The system of claim 1 wherein, the (β)×(M) filtered outputs are in a time domain, and the (β)×(K) transformed outputs are in transform domain.

7. The system of claim 1 wherein, each of the K channelized output signals is a complex baseband signal.

8. The system of claim 1 wherein, the input commutator samples the complex input signal at a fs sampling rate and samples the complex input signal by the decimation factor M using time index m, and the K channelized output signals are time indexed by the time index m.

9. The system of claim 1 wherein, the complex input signals includes a plurality of user signals occupying frequency bands of the respective K channelized output signals, at least one of the user signals occupies a plurality of frequency bands of respective ones of the K channelized output signals, at least two of the plurality of frequency bands are overlapping to form a seamless aggregate frequency bandwidth.

* * * * *